(12) United States Patent
Wang et al.

(10) Patent No.: US 10,587,013 B2
(45) Date of Patent: Mar. 10, 2020

(54) PROTECTIVE MAIN BOARD FOR BATTERY CELL, ELECTRONIC TERMINAL AND METHOD FOR ASSEMBLING BATTERY CELL OF ELECTRONIC TERMINAL

(71) Applicant: Xiaomi Inc., Beijing (CN)

(72) Inventors: Zongqiang Wang, Beijing (CN); Xianmin Zhang, Beijing (CN); Shasha Shi, Beijing (CN)

(73) Assignee: XIAOMI INC., Beijing (CN)

( * ) Notice: Subject to any disclaimer, the term of this patent is extended or adjusted under 35 U.S.C. 154(b) by 193 days.

(21) Appl. No.: 15/358,150

(22) Filed: Nov. 22, 2016

(65) Prior Publication Data
US 2017/0170526 A1    Jun. 15, 2017

(30) Foreign Application Priority Data
Dec. 15, 2015 (CN) .......................... 2015 1 0938425

(51) Int. Cl.
*H01M 10/42* (2006.01)
*B23K 26/21* (2014.01)
(Continued)

(52) U.S. Cl.
CPC .......... *H01M 10/425* (2013.01); *B23K 26/21* (2015.10); *C09J 5/00* (2013.01); *C09J 7/00* (2013.01); *C09J 9/02* (2013.01); *H01M 2/30* (2013.01); *H01M 2/34* (2013.01); *H01M 10/04* (2013.01); *H01M 10/443* (2013.01);
(Continued)

(58) Field of Classification Search
None
See application file for complete search history.

(56) References Cited

U.S. PATENT DOCUMENTS

2005/0019654 A1    1/2005   Kishida
2006/0147792 A1    7/2006   Nelson
(Continued)

FOREIGN PATENT DOCUMENTS

CN    1476114 A    2/2004
CN    1870342 A    11/2006
(Continued)

OTHER PUBLICATIONS

Extended European Search Report in European application No. 16203480.5, dated May 24, 2017.
(Continued)

*Primary Examiner* — Christopher P Domone
(74) *Attorney, Agent, or Firm* — Jun He Law Offices P.C.; James J. Zhu

(57) ABSTRACT

Disclosed are a protective main board for a battery cell, an electronic terminal and a method for assembling a battery cell of an electronic terminal. The protective main board for a battery cell includes a main board body and a conducting component. The main board body includes a main board circuit and a protection circuit configured to protect the battery cell, and the protection circuit is connected with the main board circuit. The conducting component is arranged on the main board body, and includes a first conducting member and a second conducting member, and the battery cell is electrically connected with the protection circuit through the first conducting member and the second conducting member respectively.

20 Claims, 8 Drawing Sheets

(51) Int. Cl.
*C09J 9/02* (2006.01)
*C09J 7/00* (2018.01)
*C09J 5/00* (2006.01)
*H01M 10/44* (2006.01)
*H01M 10/04* (2006.01)
*H01M 2/30* (2006.01)
*H01M 2/34* (2006.01)
*H05K 1/11* (2006.01)
*H05K 1/18* (2006.01)
*H01M 2/02* (2006.01)
*H05K 3/32* (2006.01)
*H05K 3/34* (2006.01)

(52) U.S. Cl.
CPC ............ *H05K 1/117* (2013.01); *H05K 1/181* (2013.01); *C09J 2201/602* (2013.01); *C09J 2203/33* (2013.01); *H01M 2/021* (2013.01); *H01M 2220/20* (2013.01); *H01M 2220/30* (2013.01); *H05K 3/321* (2013.01); *H05K 3/325* (2013.01); *H05K 3/3442* (2013.01); *H05K 2201/10037* (2013.01); *H05K 2201/10181* (2013.01); *H05K 2201/10409* (2013.01)

(56) References Cited

U.S. PATENT DOCUMENTS

| | | | |
|---|---|---|---|
| 2006/0251931 A1* | 11/2006 | Kim | H01M 2/04 429/7 |
| 2006/0286449 A1 | 12/2006 | Kishida | |
| 2007/0264564 A1* | 11/2007 | Johnson | H01L 23/58 429/161 |
| 2009/0263711 A1 | 10/2009 | Kim | |
| 2009/0286150 A1 | 11/2009 | Nelson et al. | |
| 2011/0268996 A1 | 11/2011 | Lee | |
| 2013/0084472 A1* | 4/2013 | Choi | H01M 2/0404 429/7 |
| 2013/0101871 A1 | 4/2013 | Byun | |
| 2014/0038031 A1 | 2/2014 | Yong et al. | |
| 2015/0372516 A1 | 12/2015 | Na et al. | |
| 2016/0079573 A1 | 3/2016 | Nelson et al. | |
| 2016/0240892 A1 | 8/2016 | Ahn et al. | |
| 2016/0308255 A1* | 10/2016 | Han | H01M 10/425 |
| 2016/0336561 A1* | 11/2016 | Miyao | H01M 2/1055 |
| 2017/0194674 A1* | 7/2017 | Lee | H01M 2/10 |

FOREIGN PATENT DOCUMENTS

| | | |
|---|---|---|
| CN | 101217191 A | 7/2008 |
| CN | 101443937 A | 5/2009 |
| CN | 101739111 A | 6/2010 |
| CN | 201754256 U | 3/2011 |
| CN | 102959766 A | 3/2013 |
| CN | 103066338 A | 4/2013 |
| CN | 103579546 A | 2/2014 |
| EP | 2385568 A2 | 11/2011 |
| EP | 2385568 A3 | 4/2015 |
| JP | H08288614 A1 | 11/1996 |
| KR | 101519510 B1 | 5/2015 |
| WO | 2015046832 A1 | 4/2015 |

OTHER PUBLICATIONS

International Search Report in international application No. PCT/CN2016/100495, dated Jan. 4, 2017.
The First Office Action in the priority application No. 201510938425.1, dated Dec. 14, 2018.
International Search Report in the international application No. PCT/CN2016/100495, dated Jan. 4, 2017.
English translation of the Written Opinion of the International Search Authority in the international application No. PCT/CN2016/100495, dated Jan. 4, 2017.
Li Qiang: "A connection between wire and wire screw" from Practical electrician repair manual published on Jun. 30, 2006. p. 186-187.
The Third Office Action of the Chinese application No. 201510938425.1, dated Jan. 2, 2020.

* cited by examiner

PROTECTIVE MAIN BOARD FOR BATTERY CELL, ELECTRONIC TERMINAL AND METHOD FOR ASSEMBLING BATTERY CELL OF ELECTRONIC TERMINAL

CROSS-REFERENCE TO RELATED APPLICATIONS

This application is filed based upon and claims priority to Chinese Patent Application No. 201510938425.1, filed on Dec. 15, 2015, the entire contents of which are incorporated herein by reference.

TECHNICAL FIELD

The present disclosure generally relates to a terminal technology, and more particularly, to a protective main board for a battery cell, an electronic terminal and a method for assembling a battery cell of an electronic terminal.

BACKGROUND

In a related technology, batteries are widely applied to various electronic terminals, the electronic terminals include, for example, consumer electronic products, smart wearable products and power and energy products, the consumer electronic products may be, for example, mobile phones, tablet computers and portable computers, the smart wearable products may be, for example, smart watches, wristbands and Bluetooth earphones, and the power and energy products may be, for example, mobile power supplies, balance vehicles and energy automobiles.

Batteries applied to all of the abovementioned electronic products usually include protective boards and battery cells. After a battery cell is produced by a battery cell manufacturer, the battery cell is sent to an assembling plant to be packaged into a battery pack, that is, a protective board is connected with the battery cell and the protective board and the battery cell are wound with a protective tape for fixation, and then the battery pack is transported to a terminal assembling plant for to be assembled with a main board. Specifically, the protective board is configured to protect the battery cell, some protection circuits such as an overcharge protection circuit, an over-discharge protection circuit, a charging and discharging temperature protection circuit and a short-circuit protection circuit are arranged on the protective board, two steel sheets are arranged on the protective board, each of two positive and negative tabs of the battery cell is connected with one of the two steel sheets respectively, and a connector is arranged at one end of the protective board, which is connected with a battery connector on the main board of an electronic terminal.

SUMMARY

According to a first aspect of the embodiment of the present disclosure, a protective main board for a battery cell is provided, which may include: a main board body including a main board circuit and a protection circuit configured to protect the battery cell; and a conducting component arranged on the main board body and including a first conducting member and a second conducting member, the battery cell being electrically connected with the protection circuit through the first conducting member and the second conducting member.

According to a second aspect of the embodiment of the present disclosure, an electronic terminal is provided. The electronic terminal includes a protective main board and a battery cell. The protective main board includes: a main board body that includes a main board circuit and a protection circuit configured to protect the battery cell; and a conducting component arranged on the main board body and including a first conducting member and a second conducting member, the battery cell being electrically connected with the protection circuit through the first conducting member and the second conducting member. The battery cell may include a first tab and a second tab, and the first tab and the second tab may be arranged on a same side of the battery cell respectively; and the first tab may be electrically connected with a first conducting member, and the second tab may be electrically connected with a second conducting member.

According to a third aspect of the embodiment of the present disclosure, a method for assembling a battery cell of an electronic terminal is provided, which may include that: a protection circuit configured to protect the battery cell is integrated to a main board body; a conducting component is arranged on the main board body, the conducting component including a first conducting member and a second conducting member; and the battery cell is electrically connected with the protection circuit through the first conducting member and the second conducting member.

It is to be understood that the above general descriptions and detailed descriptions below are only exemplary and explanatory and not intended to limit the present disclosure.

BRIEF DESCRIPTION OF THE DRAWINGS

The accompanying drawings, which are incorporated in and constitute a member of this specification, illustrate embodiments consistent with the present disclosure and, together with the specification, serve to explain the principles of the present disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of devices and methods consistent with some aspects related to the present disclosure as recited in the appended claims.

Typically, after a battery cell is produced by a manufacturer, the battery cell is delivered to a packaging plant to be packaged into a battery pack. Specifically, two steel sheets are arranged on a protective board by virtue of a Surface Mount Technology (SMT) during the process in the packaging plant, and the battery cell is provided with two tabs, i.e. a first tab and a second tab respectively. The two tabs of the battery cell are welded and fixed together with the two steel sheets in a laser welding manner to combine the battery cell and the protective board to form the battery pack. Specifically, the protective board is configured to protect the battery cell, and some protection circuits such as an overcharge protection circuit, an over-discharge protection circuit, a charging and discharging temperature protection circuit and a short-circuit protection circuit are arranged on the protective board. The two steel sheets are arranged on the protective board, and each of the two tabs of the battery cell is connected with one steel sheet. Then, the battery pack is transported to an electronic terminal assembling plant to be assembled with a main board of the electronic terminal to finally form a battery for the electronic terminal.

First of all, some terms involved in the embodiment of the present disclosure will be explained.

Main board body: a main board body is usually a rectangular circuit board on which a main circuit, i.e. a main board circuit, forming an electronic terminal is mounted, and a bearing body configured to bear the circuit in the main board body may be a Printed Circuit Board (PCB).

Protection circuit: at least includes a circuit such as an overcharge protection circuit, an over-discharge protection circuit, a charging and discharging temperature protection circuit and a short-circuit protection circuit, and is configured to protect a battery cell.

Figure 1:
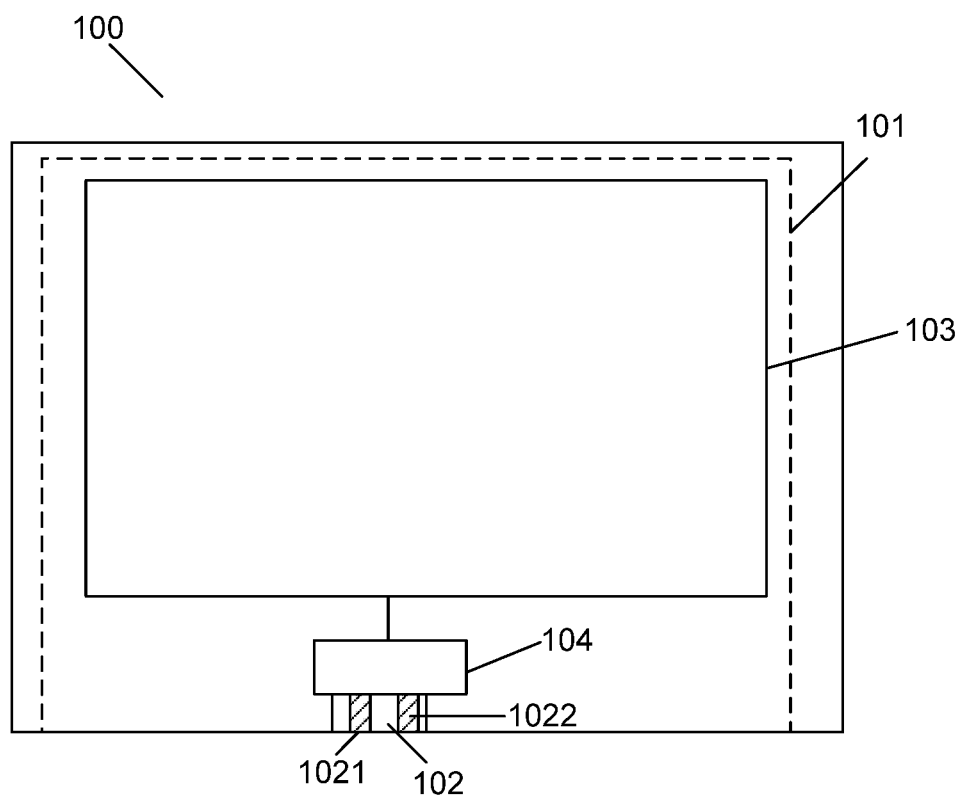
FIG. 1 is a structure diagram of a protective main board for a battery cell, according to an exemplary embodiment.

FIG. 1 is a structure diagram of a protective main board for a battery cell, according to an exemplary embodiment. Referring to FIG. 1, the main board 100 includes a main board body 101 and a conducting component 102.

Herein, a main board circuit 103 and a protection circuit 104 configured to protect the battery cell are arranged on the main board body 101, and the protection circuit 104 is connected with the main board circuit 103; and the conducting component 102 includes a first conducting member 1021 and a second conducting member 1022, and is arranged on the main board body 101, and the battery cell is electrically connected with the protection circuit 104 through the first conducting member 1021 and the second conducting member 1022.

The main board circuit 103 of the embodiment may include various chips and connecting lines. Structures of the main board circuit 103 and structures of the protection circuit 104 will not be elaborated herein. In addition, a connecting manner for the main board circuit 103 and the protection circuit 104 is electrical connection, and for example, connection between the main board circuit 103 and the protection circuit 104 is implemented through a copper wire arranged on the main board body 101.

A bearing body of the main board body 101 of the embodiment may be a PCB, and various chips and connecting lines are arranged on the PCB. Since there are more circuits on the main board body 101, the main board body 101 is usually divided into multiple layers of PCBs, corresponding circuits are arranged on each layer of PCB to reduce an area occupied by the main board body 101, and in such a manner, there is more or less an idle space where no circuits are arranged on the main board body 101. In the embodiment, the protection circuit 104 which is originally arranged on the protective board is arranged in the idle space, so that the idle space of the main board body 101 is fully utilized. Of course, the protection circuit 104 may also be arranged at a position where a battery connector is originally arranged on the main board body 101 in the embodiment, which may specifically be set according to a practical requirement and will not be elaborated herein.

Optionally, the first conducting member 1021 and second conducting member 1022 of the conducting component 102 of the embodiment may be sheet metal, and for example, both the first conducting member 1021 and the second conducting member 1022 are steel sheets. The conducting component 102 is configured to be connected with the battery cell to further connect the battery cell with the main board 100 directly instead of through the protective board.

A connecting manner for the conducting component 102 and the main board body 101 may be welding or threaded connection. When the connecting manner is welding connection, the main board 100 further includes a first welding layer (not shown in the figure) arranged on the protection circuit 104, and the first conducting member 1021 and the second conducting member 1022 are electrically connected with the protection circuit 104 through the first welding layer. When the connecting manner is threaded connection, the main board further includes a first threaded structure (not shown in the figure) arranged on one side of an outer surface of the protection circuit 104, the first conducting member 1021 and the second conducting member 1022 are electrically connected with the protection circuit 104 through the first threaded structure, the first threaded structure may include at least two first screws and at least two first gaskets, and the first screws are positioned on upper surfaces of the first gaskets.

In addition, the conducting component 102 may be arranged on the main board body 101 in an SMT manner in the embodiment, and the SMT manner is the most popular technology and process in the present electronic assembling industry, and will not be elaborated.

According to the embodiment, the protection circuit 104 on the protective board is arranged on the main board 100, then the battery cell may be directly transported to a terminal assembling plant without the step of manufacturing the protective board for a battery cell to protect the battery cell by a packaging plant in the conventional art after being delivered from a manufacturer, and the terminal assembling plant integrates the protective board to the main board of the terminal, so that an intermediate transportation process is shortened, a production cycle of an electronic terminal product is further shortened, and cost is reduced.

According to the embodiment, the battery cell for the electronic terminal is required to be provided with the protection circuit on the basis of a safety requirement, the protection circuit 104 is integrated to the main board body 101 to form the main board 100 so that the main board 100 can be directly connected with the battery cell, in this way, not only may a space occupied by the protective board be saved to enlarge a size of the battery cell and thus increase electric capacity, but also the transportation process may be shortened to shorten the production cycle of the electronic terminal product and reduce the cost. In addition, electric power consumption caused by passing of electric power provided by the battery cell through the protective board and a connector in a process for the electric power to reach the main board from the battery cell may further be avoided as much as possible, and a utilization rate of the electric power may be increased.

Figure 2A:
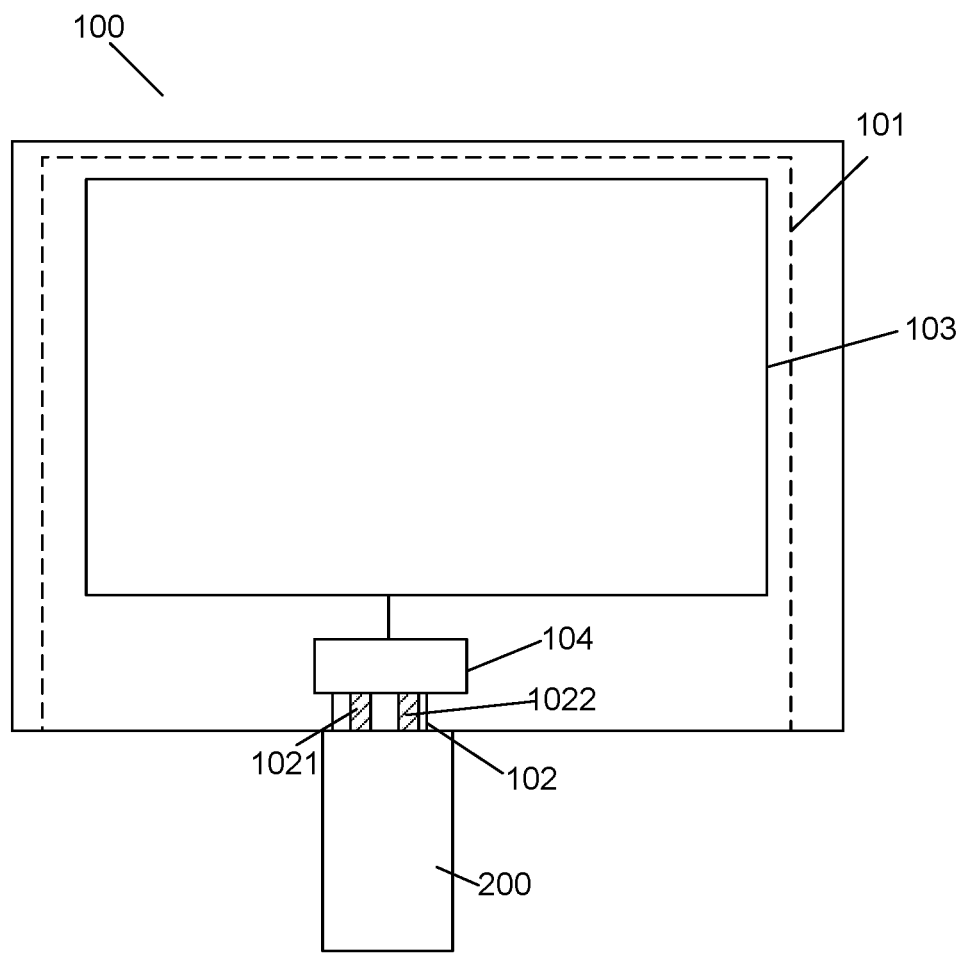
FIG. 2A is a structure diagram of an electronic terminal, according to an exemplary embodiment.
Figure 2B:
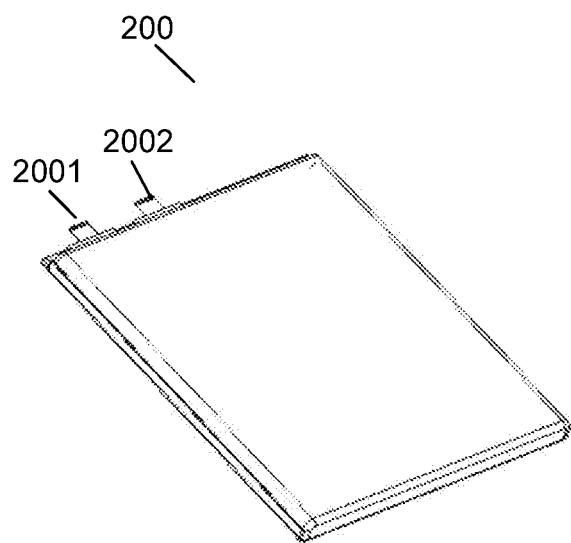
FIG. 2B is a structure diagram of a battery cell, according to an exemplary embodiment.

FIG. 2A is a structure diagram of an electronic terminal, according to an exemplary embodiment. Referring to FIG. 2A, the electronic terminal includes the main board 100 of the abovementioned embodiment, and further includes a battery cell 200, and the battery cell 200 is connected with a conducting component 102. FIG. 2B is a structure diagram of a battery cell, the battery cell 200 includes a first tab 2001 and a second tab 2002, the first tab 2001 and the second tab 2002 are arranged on a same side of the battery cell 200 respectively, the first tab 2001 is electrically connected with a first conducting member 1021, and the second tab 2002 is electrically connected with a second conducting member 1022.

A connecting manner for a battery cell 200 and a conducting component 102 may be specifically described below.

In some embodiments, the battery cell 200 is connected with the conducting component 102 by welding, as detailed below.

Figure 3A:
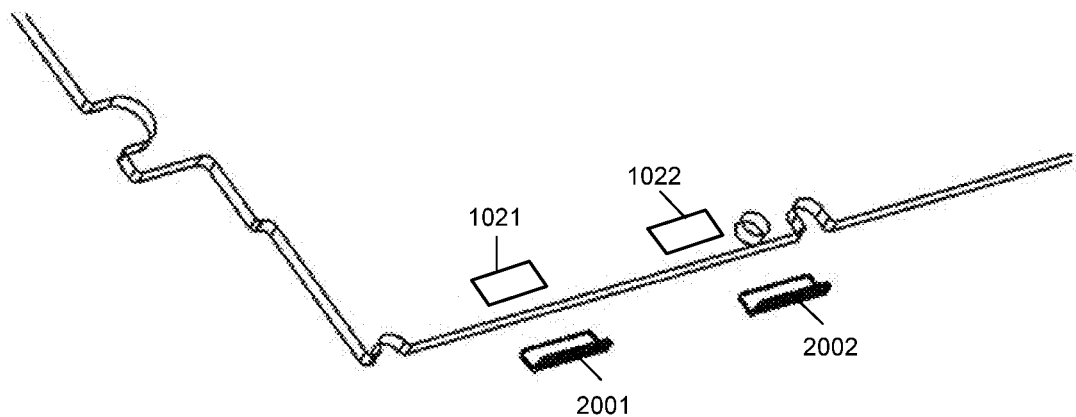
FIG. 3A is a position and structure diagram before a battery cell is connected with a conducting component, according to another exemplary embodiment.
Figure 3B:
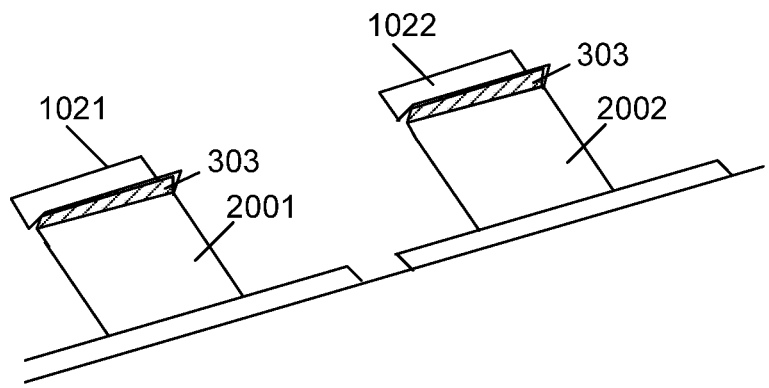
FIG. 3B is a position and structure diagram after a battery cell is connected with a conducting component, according to another exemplary embodiment.

FIG. 3A is a position and structure diagram before a battery cell 200 is connected with a conducting component, and FIG. 3B is a position and structure diagram after the battery cell is connected with the conducting component. A distance between the first conducting member 1021 and second conducting member 1022 of the embodiment is equal to a distance between the first tab 2001 and second tab 2002 of the battery cell.

In the embodiment, the condition that the first tab 2001 is electrically connected with the first conducting member 1021 and the second tab 2002 is electrically connected with the second conducting member 1022 includes that: a second welding layer 303 is arranged on a protection circuit 104, the first tab 2001 is electrically connected with the first conducting member 1021 through the second welding layer 303, and the second tab 2002 is electrically connected with the second conducting member 1022 through the second welding layer. As shown in FIG. 3B, the second welding layer 303 is formed after welding.

In some embodiments, the battery cell 200 is connected with the conducting component 102 by threaded connection through a first threaded structure, as detailed below.

Figure 4A:
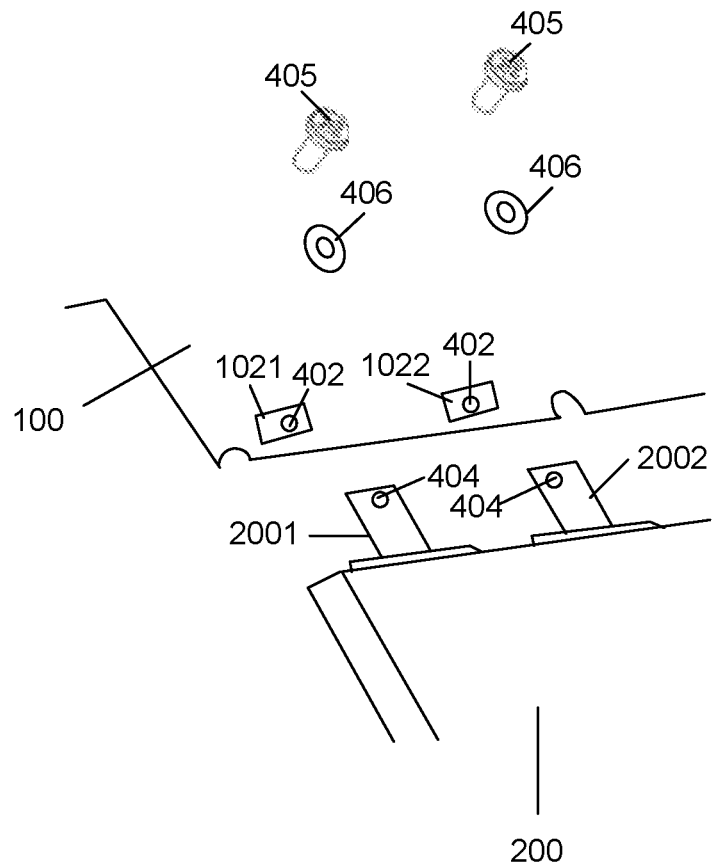
FIG. 4A is a structure diagram before a battery cell is connected with a conducting component, according to another exemplary embodiment.
Figure 4B:
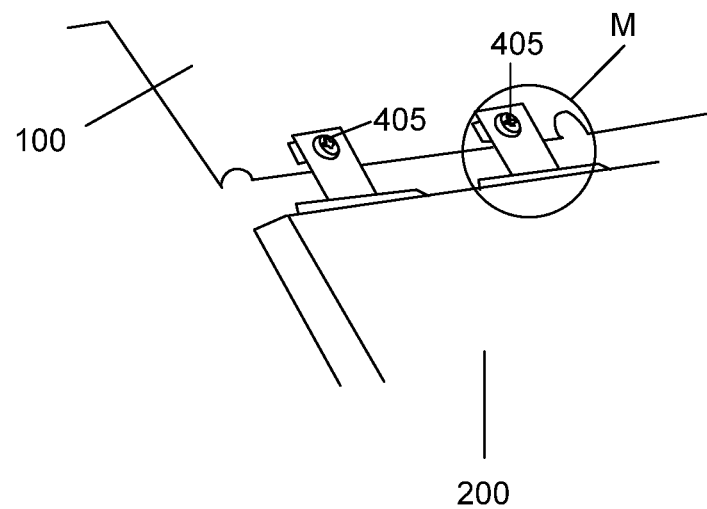
FIG. 4B is a structure diagram after a battery cell is connected with a conducting component, according to another exemplary embodiment.
Figure 4C:
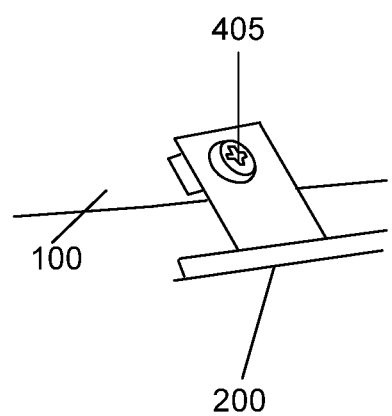
FIG. 4C is an enlarged structure diagram of position M in FIG. 4B.

FIG. 4A is a structure diagram before a battery cell 200 is connected with a conducting component; FIG. 4B is a structure diagram after the battery cell 200 is connected with the conducting component; and FIG. 4C is an enlarged structure diagram of position M in FIG. 4B.

In the embodiment, the condition that the first tab 2001 is electrically connected with the first conducting member 1021 and the second tab 2002 is electrically connected with the second conducting member 1022 includes that: a second threaded structure is arranged on the protection circuit 104, the first tab 2001 is electrically connected with the first conducting member 1021 through the second threaded structure, and the second tab 2002 is electrically connected with the second conducting member 1022 through the second threaded structure, herein first connecting holes 402 are formed in both the first conducting member 1021 and the second conducting member 1022, second connecting holes 404 are formed in both the first tab 2001 and the second tab 2002, the second threaded structure of the embodiment may include at least two second screws 405 and at least two second gaskets 406, and the second screws 405 are positioned on upper surfaces of the second gaskets 406. As shown in FIG. 4B, the two second screws 405 may penetrate through the first connecting holes 402 and the second connecting holes 404 to further fixedly connect the conducting component with the battery cell respectively, and the second gaskets 406 may be arranged between the second screws 405 and the steel sheets.

Optionally, the second screws 405 of the embodiment may be insulating screws, and the second gaskets 406 may be insulating gaskets, so that influence of electrical connection between the second screws 405 and other parts on quality of the electronic terminal is avoided.

In such a threaded connecting manner, the battery cell 200 may be detachably connected with the main board 100 to further facilitate assembling or maintenance of the electronic terminal.

In some embodiments, the battery cell 200 is connected with the conducting component 102 by conductive adhesion, as detailed below.

Figure 5:
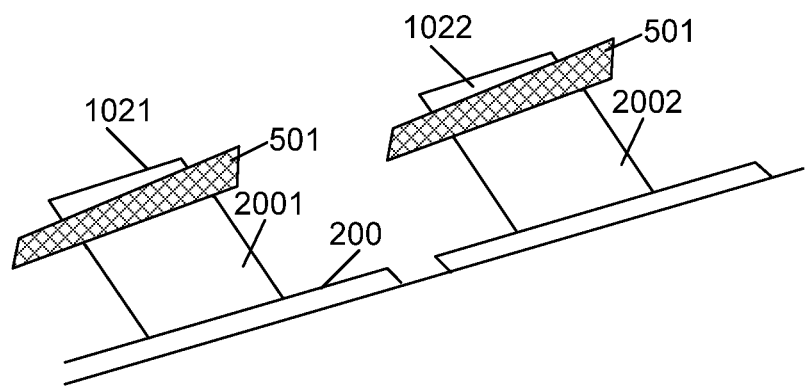
FIG. 5 is a structure diagram after a battery cell is connected with a conducting component, according to another exemplary embodiment.

As shown in FIG. 5, a conductive connecting layer 501 is arranged above the first conducting member 1021 and the second conducting member 1022, the battery cell 200 is electrically connected with the first conducting member 1021 and the second conducting member 1022 through the conductive connecting layer 501, and the conductive connecting layer 501 is a conductive adhesive tape.

Another manner of clamping connection through a clamp and the like may be adopted to implement connection between the conducting component and the battery cell, may specifically be selected according to a practical requirement, and will not be elaborated herein.

According to the embodiment, the battery cell for the electronic terminal is required to be provided with the protection circuit on the basis of a safety requirement, the protection circuit is integrated to the main board body to form the main board so that the main board can be directly connected with the battery cell, in this way, not only may a space occupied by the protective board be saved to enlarge a size of the battery cell and thus increase electric capacity, but also a transportation process may be shortened to shorten a production cycle of an electronic terminal product and reduce cost. In addition, electric power consumption caused by passing of electric power provided by the battery cell through the protective board and a connector in a process for the electric power to reach the main board from the battery cell may further be avoided as much as possible, and a utilization rate of the electric power may be increased.

Figure 6:
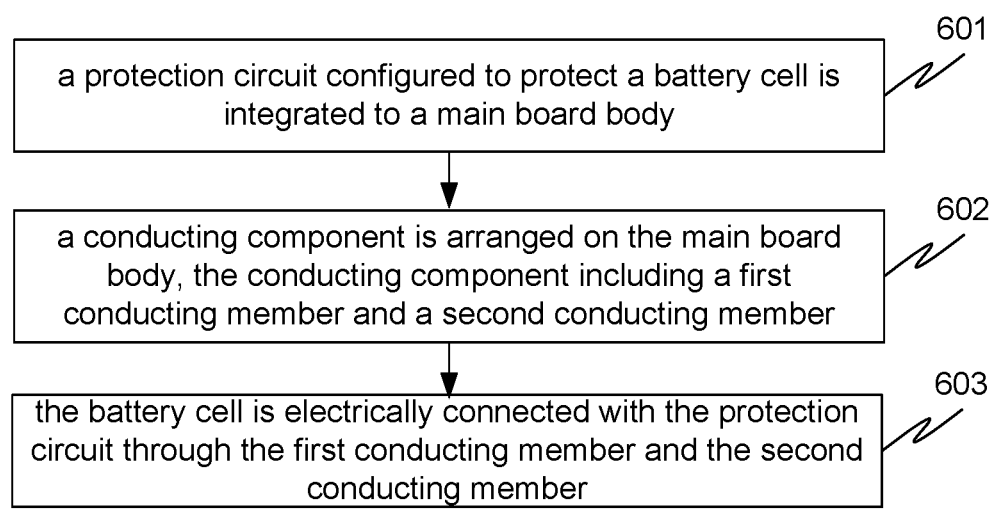
FIG. 6 is a flow chart showing a method for assembling a battery cell of an electronic terminal, according to an exemplary embodiment.

In some embodiment, a method for assembling a battery cell of an electronic terminal is provided. FIG. 6 is a flow chart showing a method for assembling a battery cell of an electronic terminal, according to an exemplary embodiment. As shown in FIG. 6, the method for assembling a battery cell of an electronic terminal includes the following steps.

Step S601: a protection circuit configured to protect the battery cell is integrated to a main board body.

The battery cell may be directly sent to a terminal assembling plant after being produced by a manufacturer of the battery cell.

A bearing body of the main board body may be a PCB, and various chips and connecting lines are arranged on the PCB. Since there are more circuits on the main board body, the main board body is usually divided into multiple layers of PCBs, corresponding circuits are arranged on each layer of PCB to reduce an area occupied by the main board body, and in such a manner, there is more or less an idle space where no circuits are arranged on the main board body. In the embodiment, the protection circuit which is originally arranged on a protective board is arranged in the idle space, so that the idle space of the main board body may be fully utilized. Of course, the protection circuit may also be arranged at a position where a battery connector is originally arranged on the main board body in the embodiment, which may specifically be set according to a practical requirement and will not be elaborated herein.

Step S602: a conducting component is arranged on the main board body, the conducting component including a first conducting member and a second conducting member.

Specifically, the conducting component may be arranged on the main board body in an SMT manner, and of course, a welding or threaded connecting manner may also be adopted to arrange the conducting component on the main board body, may specifically be set according to a practical requirement, and will not be elaborated.

A first conducting member is a steel sheet and a second conducting member is a steel sheet, or the first conducting member is a metal wire and the second conducting member is a metal wire, which may specifically be selected according to a practical requirement.

Step S603: the battery cell is electrically connected with the protection circuit through the first conducting member and the second conducting member.

Step S603 may be implemented in various manners.

In some embodiments, Step 603 may be implemented by the following steps: a first tab and a second tab are formed on the battery cell, and a second welding layer is formed on the protection circuit; the first tab is electrically connected with the first conducting member through the second welding layer; and the second tab is electrically connected with the second conducting member through the second welding layer.

That is, the second welding layer is formed in a welding manner, and the second welding layer is connected with the battery cell and the conducting component to implement electrical connection between the battery cell and the conducting component respectively.

Specifically, electrical connection between the battery cell and the conducting component may be implemented by laser welding, laser welding is an efficient and precise welding method employing a high-energy-density laser beam as a heat source, and its welding accuracy is relatively higher.

In some embodiments, Step 603 may be implemented by the following steps: a second threaded structure is formed on the protection circuit; the first tab is electrically connected with the first conducting member through the second threaded structure; and the second tab is electrically connected with the second conducting member through the second threaded structure.

Specifically, the conducting component and the tabs of the battery cell are perforated to form first connecting holes and second connecting holes respectively, and the conducting component and the battery cell are locked by screws after the first connecting holes and the second connecting holes are aligned.

In some embodiments, Step 603 may be implemented by the following steps: a conductive connecting layer is arranged above the first conducting member and the second conducting member; and the battery cell is connected with the first conducting member and the second conducting member through the conductive connecting layer, the conductive connecting layer being a conductive adhesive tape.

Of course, clamping with a clamp and another manner may also be adopted to implement connection between the battery cell and the conducting component, and will not be elaborated.

Figure 7A:
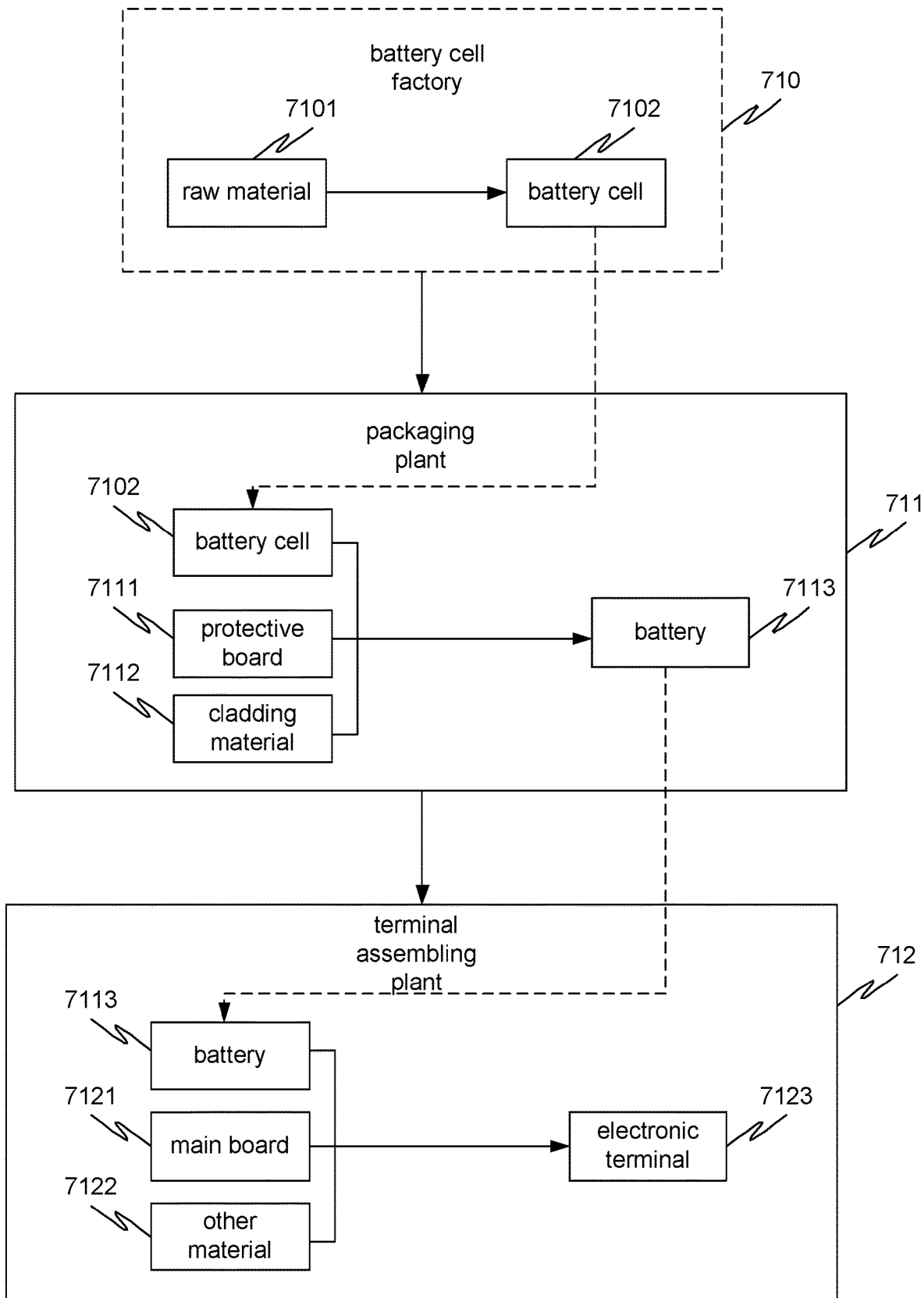
FIG. 7A is a flow chart showing production of an electronic terminal in a conventional art.

FIG. 7A is a flow chart showing production of an electronic terminal in the conventional art. A battery cell 7102 is produced from a raw material 7101 in a battery cell factory 710 at first, then the battery cell 7102 is transported to a packaging plant 711, the battery cell 7102 is packaged by a protective board 7111 and a cladding material 7112 to form a battery 7113 in the packaging plant 711, the battery 7113 is transported to a terminal assembling plant 712, and the battery 7113 is electrically connected with a main board 7121 and assembled with another material 7122 to form an electronic terminal 7123 in the terminal assembling plant 712. That is, three places, i.e. the battery cell factory 710, the packaging plant 711 and the terminal assembling plant 712, are required by production of the electronic terminal in the conventional art.

Figure 7B:
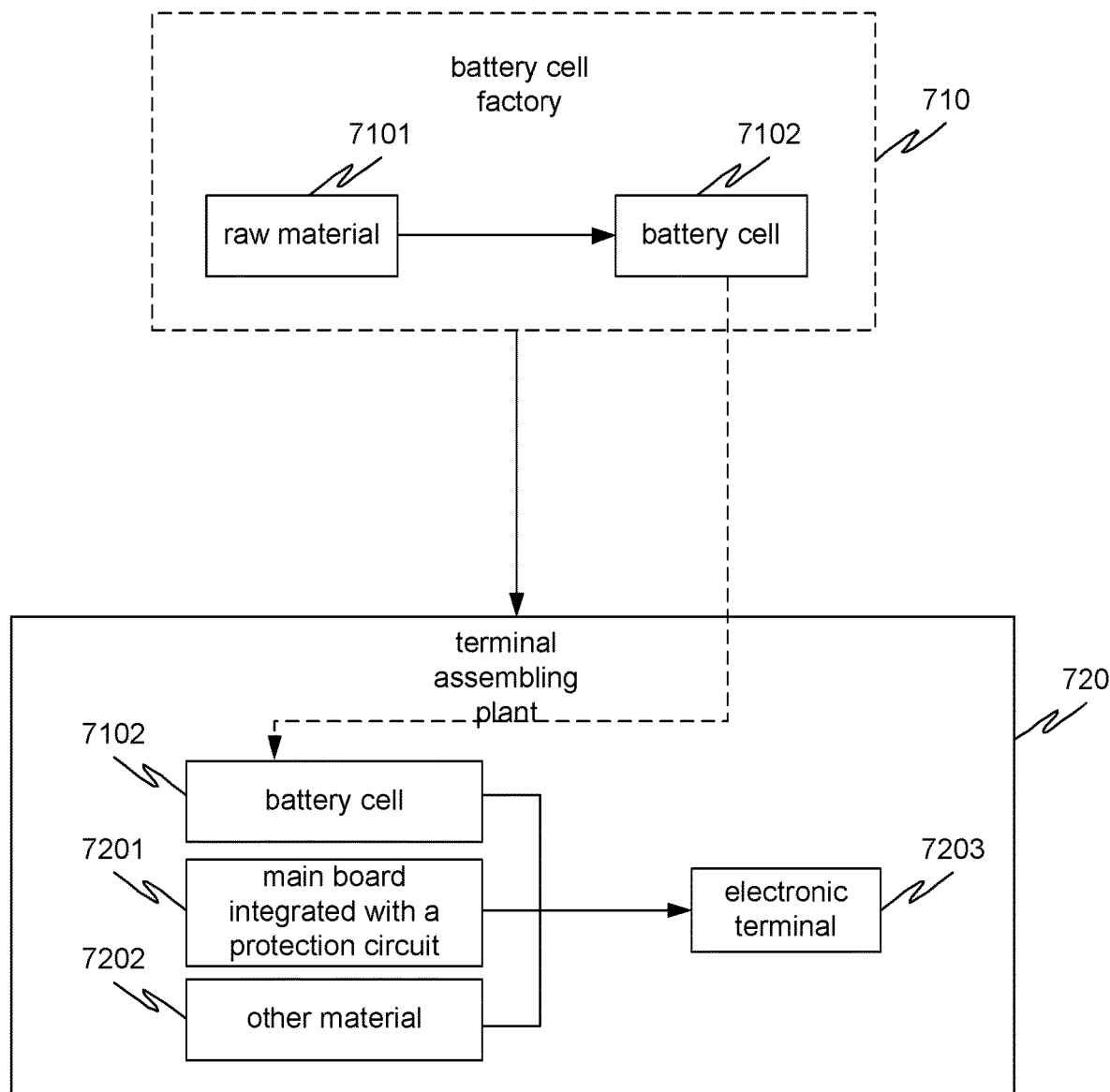
FIG. 7B is a flow chart showing production of a battery cell for an electronic terminal, according to an exemplary embodiment.

FIG. 7B is a flow chart showing production of a battery cell for an electronic terminal, according to an exemplary embodiment. A battery cell 7102 is produced from a raw material 7101 in a battery cell factory 710 at first, then the battery cell 7102 is directly transported to a terminal assembling plant 720, and the battery cell 7102 is electrically connected with a main board 7201 integrated with a protection circuit and is assembled with another material 7202 to form an electronic terminal 7203 in the terminal assembling plant 720. That is, two places, i.e. the battery cell factory 710 and the terminal assembling plant 720, are required by production of the electronic terminal in the embodiment, and an intermediate packaging plant 711 is eliminated, so that transportation and storage times may be reduced, and a material preparation cycle for materials such as the protective board may be reduced.

According to the embodiment, the battery cell for the electronic terminal is required to be provided with the protection circuit on the basis of a safety requirement, the protection circuit is integrated to the main board body to form the main board so that the main board can be directly connected with the battery cell, in this way, not only may a space occupied by the protective board be saved to enlarge a size of the battery cell and thus increase electric capacity, but also a transportation process may be shortened to shorten a production cycle of an electronic terminal product and reduce cost. In addition, electric power consumption caused by passing of electric power provided by the battery cell through the protective board and a connector in a process for the electric power to reach the main board from the battery cell may further be avoided as much as possible, and a utilization rate of the electric power may be increased.

Other embodiments of the present disclosure will be apparent to those skilled in the art from consideration of the specification and practice of the present disclosure. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes may be made without departing from the scope thereof. It is intended that the scope of the present disclosure only be limited by the appended claims.

INDUSTRIAL APPLICABILITY

The embodiment of the present disclosure may achieve the following beneficial effects: the battery cell for the electronic terminal is required to be provided with the protection circuit on the basis of a safety requirement, the protection circuit is integrated to the main board body to form the main board so that the main board can be directly connected with the battery cell. In this way, not only may a space occupied by the protective board be saved to enlarge a size of the battery cell and thus increase electric capacity, but also a transportation process may be shortened to shorten a production cycle of an electronic terminal product and reduce cost. In addition, electric power consumption caused by passing of electric power provided by the battery cell through the protective board and a connector in a process for the electric power to reach the main board from the battery cell may further be avoided as much as possible, and a utilization rate of the electric power may be increased.

What is claimed is:

1. A protective main board for a battery cell of an electronic terminal, the protective main board comprising:
    a main board body comprising a main board circuit and a protection circuit configured to protect the battery cell, the main board circuit being a main circuit forming the electronic terminal, and the protection circuit comprising at least an overcharge protection circuit, an over-discharge protection circuit, a charging and discharging temperature protection circuit and a short-circuit protection circuit; and
    a conducting component arranged on the main board body and comprising a first conducting member and a second conducting member, the battery cell being electrically connected with the protection circuit through the first conducting member and the second conducting member;
    wherein the protective main board is configured for detachably connecting with the battery cell.

2. The protective main board for a battery cell according to claim 1, further comprising a first welding layer arranged on the protection circuit, wherein the first conducting member and the second conducting member are electrically connected with the protection circuit through the first welding layer.

3. The protective main board for a battery cell according to claim 1, further comprising a first threaded structure arranged on an outer surface of the protection circuit, wherein the first conducting member and the second conducting member are electrically connected with the protection circuit through the first threaded structure.

4. The protective main board for a battery cell according to claim 3, wherein the first threaded structure comprises: at least two first screws and at least two first gaskets, and the first screws are positioned on upper surfaces of the first gaskets.

5. The protective main board for a battery cell according to claim 1, wherein the first conducting member is a steel sheet, and the second conducting member is a steel sheet.

6. An electronic terminal, comprising:
    a protective main board for a battery cell of the electronic terminal, the protective main board comprising:
    a main board body comprising a main board circuit and a protection circuit, the main board circuit being a main circuit forming the electronic terminal, and the protection circuit comprising at least an overcharge protection circuit, an over-discharge protection circuit, a charging and discharging temperature protection circuit and a short-circuit protection circuit; and
    a conducting component arranged on the main board body, wherein the conducting component comprises a first conducting member and a second conducting member;
    the battery cell electrically connected with the protection circuit through the first conducting member and the second conducting member, wherein the battery cell has a first tab electrically connected with the first conducting member and a second tab electrically connected with the second conducting member, and wherein the first tab and the second tab are arranged on a same side of the battery cell respectively;
    wherein the battery cell is detachably connected with the protective main board.

7. The electronic terminal according to claim 6, wherein the protection circuit comprises a second welding layer, and wherein the first tab is electrically connected with the first conducting member through the second welding layer, and the second tab is electrically connected with the second conducting member through the second welding layer.

8. The electronic terminal according to claim 6, wherein the protection circuit comprises a second threaded structure, and wherein the first tab is electrically connected with the first conducting member through the second threaded structure, and the second tab is electrically connected with the second conducting member through the second threaded structure.

9. The electronic terminal according to claim 8, wherein the second threaded structure comprises:
    at least two second gaskets; and
    at least two second screws positioned on upper surfaces of the second gaskets.

10. The electronic terminal according to claim 6, further comprising:
    a conductive connecting layer arranged above the first conducting member and the second conducting member, wherein the conductive connecting layer comprises a conductive adhesive tape;
    wherein the battery cell is electrically connected with the first conducting member and the second conducting member through the conductive connecting layer.

11. The electronic terminal according to claim 6, wherein the protection circuit comprises a first welding layer, and wherein the first conducting member and the second conducting member are electrically connected with the protection circuit through the first welding layer.

12. The electronic terminal according to claim 11, wherein the protection circuit comprises a second welding layer, and wherein the first tab is electrically connected with the first conducting member through the second welding layer, and the second tab is electrically connected with the second conducting member through the second welding layer.

13. The electronic terminal according to claim 11, wherein the protection circuit comprises a second threaded structure, and wherein the first tab is electrically connected with the first conducting member through the second threaded structure, and the second tab is electrically connected with the second conducting member through the second threaded structure.

14. The electronic terminal according to claim 13, wherein the second threaded structure comprises:
    at least two second gaskets; and
    at least two second screws positioned on upper surfaces of the second gaskets.

15. The electronic terminal according to claim 11, further comprising:
    a conductive connecting layer arranged above the first conducting member and the second conducting member and comprising a conductive adhesive tape;
    wherein the battery cell is electrically connected with the first conducting member and the second conducting member through the conductive connecting layer.

16. The electronic terminal according to claim 6, wherein the protective main board comprises a first threaded structure arranged on an outer surface of the protection circuit, and wherein the first conducting member and the second conducting member are electrically connected with the protection circuit through the first threaded structure.

17. A method for assembling a battery cell of an electronic terminal, the method comprising:
    integrating a protection circuit configured to protect the battery cell to a main board body comprising a main board circuit, the main board circuit being a main circuit forming the electronic terminal, and the protection circuit comprising at least an overcharge protection circuit, an over-discharge protection circuit, a charging and discharging temperature protection circuit and a short-circuit protection circuit;
    arranging a conducting component on the main board body, the conducting component comprising a first conducting member and a second conducting member; and
    electrically connecting the battery cell with the protection circuit through the first conducting member and the second conducting member;
    wherein the battery cell is detachably connected with the main board body.

18. The method for assembling a battery cell of an electronic terminal according to claim 17, wherein
    electrically connecting the battery cell with the protection circuit through the first conducting member and the second conducting member comprises:
    forming a first tab and a second tab on the battery cell, and forming a second welding layer on the protection circuit;
    electrically connecting the first tab with the first conducting member through the second welding layer; and
    electrically connecting the second tab with the second conducting member through the second welding layer.

19. The method for assembling a battery cell of an electronic terminal according to claim 17, wherein electrically connecting the battery cell with the protection circuit through the first conducting member and the second conducting member comprises:
    arranging a second threaded structure on the protection circuit;
    electrically connecting the first tab with the first conducting member through the second threaded structure; and
    electrically connecting the second tab with the second conducting member through the second threaded structure.

20. The method for assembling a battery cell of an electronic terminal according to claim 17, wherein electrically connecting the battery cell with the protection circuit through the first conducting member and the second conducting member comprises:
    arranging a conductive connecting layer above the first conducting member and the second conducting member; and
    electrically connecting the battery cell with the first conducting member and the second conducting member through the conductive connecting layer, the conductive connecting layer being a conductive adhesive tape.

* * * * *